(12) United States Patent
Fuller et al.

(10) Patent No.: US 12,394,652 B2
(45) Date of Patent: Aug. 19, 2025

(54) SEMICONDUCTOR SUBSTRATE CARRYING CONTAINER WITH FRONT AND REAR OPENINGS

(71) Applicant: ENTEGRIS, INC., Billerica, MA (US)

(72) Inventors: Matthew A. Fuller, Colorado Springs, CO (US); Jeffery J. King, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 200 days.

(21) Appl. No.: 17/690,388

(22) Filed: Mar. 9, 2022

(65) Prior Publication Data
US 2022/0293446 A1 Sep. 15, 2022

Related U.S. Application Data

(60) Provisional application No. 63/159,244, filed on Mar. 10, 2021.

(51) Int. Cl.
*H01L 21/677* (2006.01)

(52) U.S. Cl.
CPC .. *H01L 21/67769* (2013.01); *H01L 21/67778* (2013.01)

(58) Field of Classification Search
CPC ......... H01L 21/67778; H01L 21/67769; H01L 21/67386; B65D 85/58; B65D 25/107; B60B 11/06; B60B 3/14; B60B 3/08; B60B 19/12; B60B 27/00; B60B 27/0015; B60B 25/002; B64D 9/00; B64D 2009/006

See application file for complete search history.

(56) References Cited

U.S. PATENT DOCUMENTS

| | | | |
|---|---|---|---|
| 5,788,082 A | 8/1998 | Nyseth | |
| 9,312,157 B2* | 4/2016 | Adams | H01L 21/67369 |
| 10,475,682 B2* | 11/2019 | Fuller | H01L 21/67383 |
| 2006/0177287 A1* | 8/2006 | Wu | H01L 21/67778 |
| | | | 414/217 |
| 2008/0124192 A1 | 5/2008 | Karasawa | |
| 2015/0030416 A1 | 1/2015 | Sakiya | |
| 2015/0041360 A1 | 2/2015 | Watson | |
| 2018/0141219 A1 | 5/2018 | Bonora | |
| 2021/0111048 A1* | 4/2021 | Narita | H01L 21/67126 |

FOREIGN PATENT DOCUMENTS

| | | |
|---|---|---|
| JP | H11220016 A | 8/1999 |
| KR | 101804721 B1 | 12/2017 |

* cited by examiner

*Primary Examiner* — Glenn F Myers (57) ABSTRACT

A semiconductor substrate carrying container, such as a front opening unified pod, is configured such that a semiconductor substrate can be accessed and removed from or inserted into an interior space of the container via a rear opening that is located opposite a front opening that also permits removal and insertion therethrough. The removal and insertion via the rear opening can be achieved in any suitable manner including, but not limited to, using an automated mechanism, such as a robot arm, or manually.

17 Claims, 8 Drawing Sheets

SEMICONDUCTOR SUBSTRATE CARRYING CONTAINER WITH FRONT AND REAR OPENINGS

FIELD

This technical disclosure relates to semiconductor substrate carrying containers such as front opening unified pods (FOUPs), for example those used in semiconductor manufacturing.

BACKGROUND

Substrate carrying containers are used to transport substrates during semiconductor manufacturing. Substrate carrying containers include, for example, FOUPs. FOUPs typically include a shell which provides an internal space for holding substrates, and a plate that is used to interface with various conveyors and other devices, for example so that the FOUP can be moved around the processing facility. A FOUP typically includes a front opening through which a substrate can be removed and inserted into the FOUP.

SUMMARY

Semiconductor substrate carrying containers, such as FOUPs, are described herein where a semiconductor substrate can be accessed and removed from or inserted into an interior space of the container via a rear opening that is located opposite a front opening that also permits removal and insertion therethrough. The removal and insertion via the rear opening can be achieved in any suitable manner including, but not limited to, using an automated mechanism, such as a robot arm, or manually.

The semiconductor substrates can be any substrates used in semiconductor manufacturing. Examples of the semiconductor substrates that can be located in the containers described herein can include, but are not limited to, wafers and panels (such as flat panels), and combinations thereof.

A semiconductor substrate may be removed from the container through the rear opening, a semiconductor substrate may be inserted into the container through the rear opening, or a semiconductor substrate may be removed from the container through the rear opening and thereafter that same semiconductor substrate may be inserted back into the container through the rear opening. In one embodiment, a semiconductor substrate may be removed from the container through the rear opening, and that same semiconductor substrate may thereafter be inserted back into the container through the front opening. In another embodiment, a semiconductor substrate may be removed from the container through the front opening, and that same semiconductor substrate may thereafter be inserted back into the container through the rear opening. In another embodiment, a semiconductor may be removed from the container through the rear opening and never inserted back into the container. In another embodiment, a semiconductor substrate may be inserted into the container for the first time through the rear opening and thereafter not removed from the container until processing is completed.

In an embodiment, a semiconductor substrate carrying container described herein can include a container shell having a plurality of walls, a front, and a rear, where the plurality of walls define an interior space that is sized to be able to receive a plurality of semiconductor substrates therein. A front opening is located at the front of the container shell and through which a semiconductor substrate is able to be removed from and inserted into the interior space. In addition, a rear opening is located at the rear of the container shell and through which a semiconductor substrate is able to be removed from and inserted into the interior space.

In another embodiment, a FOUP described herein can include a shell having a front opening and an interior space. A rear opening is located at a rear of the shell opposite the front opening and through which a semiconductor substrate is able to be removed from and inserted into the interior space. In addition, a plurality of pairs of opposing support ledges are disposed within the interior space and are attached to side walls of the shell. Each pair of opposing support ledges is configured to support a semiconductor substrate in the interior space.

In still another embodiment, a method described herein includes removing a semiconductor substrate from or inserting a semiconductor substrate into an interior space of a semiconductor substrate carrying container through a rear opening at a rear of the semiconductor substrate carrying container located opposite a front opening of the semiconductor substrate carrying container.

DETAILED DESCRIPTION

Figure 1:
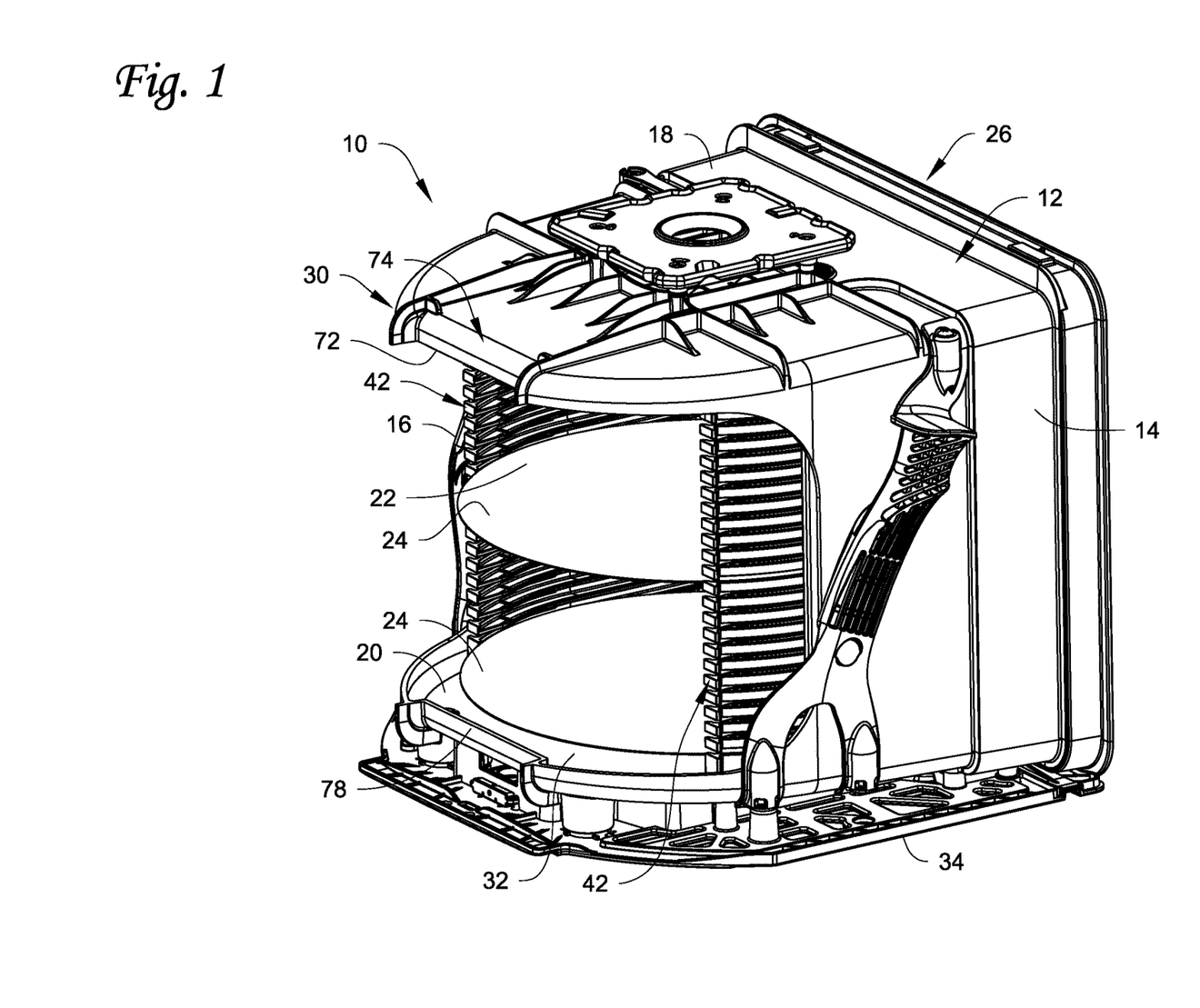
FIG. 1 is a rear perspective view of a semiconductor substrate carrying container having a rear opening.
Figure 2:
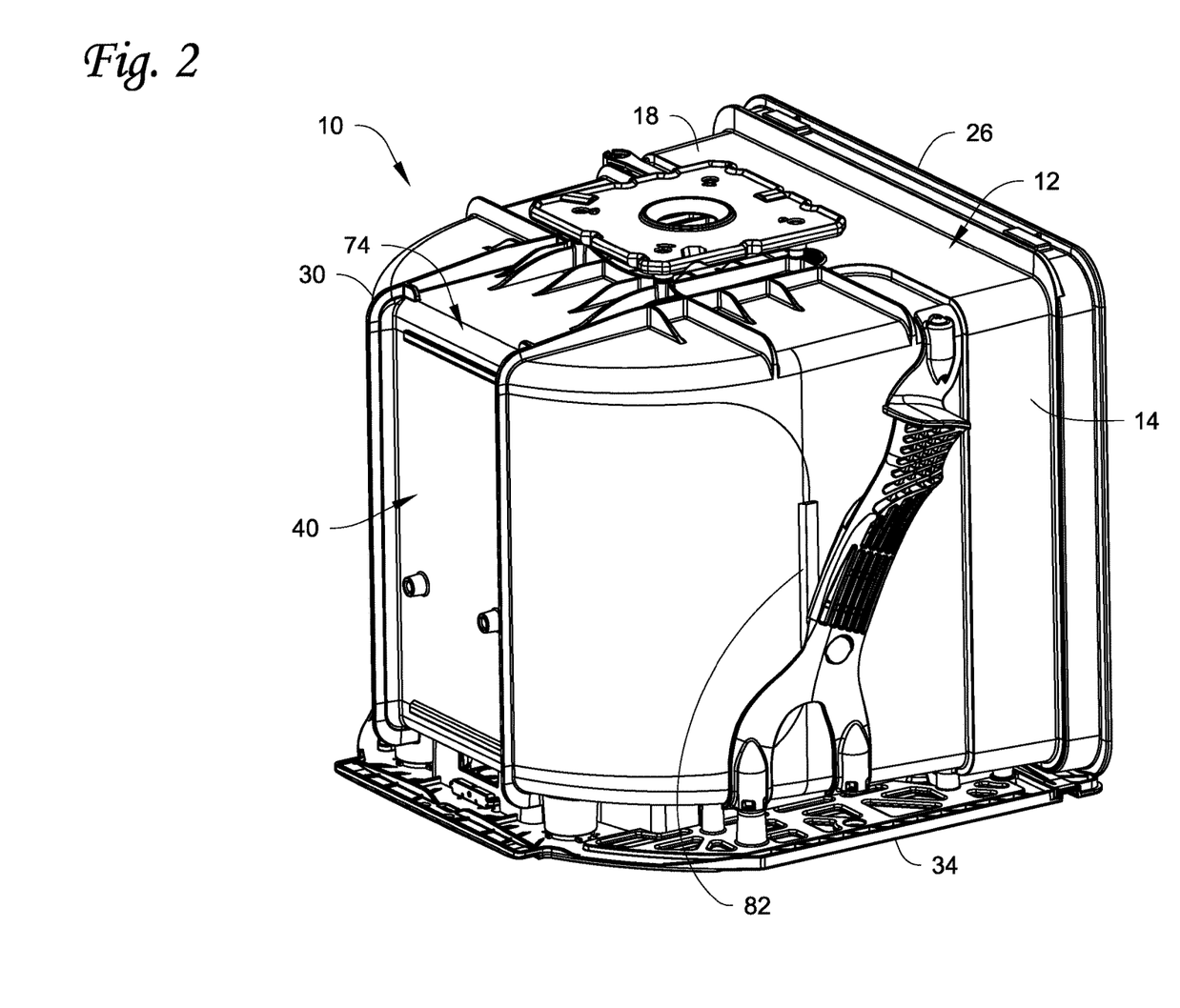
FIG. 2 is a rear perspective view similar to FIG. 1 but showing an optional removable cover in place on the container covering the rear opening

With reference to FIGS. 1-2, an example of a semiconductor substrate carrying container 10 is depicted. In one embodiment, the container 10 may be referred to as a FOUP. The container 10 includes a container shell 12 having a plurality of walls including a first side wall 14, a second side wall 16 opposite the first side wall 14, a top wall 18, and a bottom wall 20 opposite the top wall 18. The walls define an interior space 22 that is sized to be able to receive a plurality of semiconductor substrates 24 therein (for sake of convenience, semiconductor substrates 24 are only visible at positions 2 and 13 in FIG. 1). In one embodiment, the container 10 can be configured to receive and hold twenty-four substrates 24, although the container 10 can be configured to hold a larger or smaller number of substrates 24. The container 10 further includes a front 26 having a front opening 28 (visible in FIG. 5) through which each one of the semiconductor substrates 24 is able to be removed from and inserted into the interior space 22, and a rear 30 having a rear opening 32 through which each one of the semiconductor substrates 24 is able to be removed from and inserted into the interior space 22. In addition, a machine interface plate 34 is secured to the bottom wall 20 of the shell 12.

The semiconductor substrates 24 can be any substrates used in semiconductor manufacturing. Examples of the semiconductor substrates 24 that can be located in the containers 10 described herein can include, but are not limited to, wafers and panels (such as flat panels), and combinations thereof. The embodiment in FIG. 1 depicts the substrates 24 as being wafers.

The substrate container 10 can be formed from one or more polymer materials including, but not limited to, injection-moldable polymer materials. The polymer material(s) can include, but are not limited to, one or more polyolefins, one or more polycarbonate, one or more thermoplastic polymers and the like. In an embodiment, some or all of the substrate container 10 can be injection molded. The one or more polymer materials can form a matrix including carbon fill. In an embodiment, the one or more polymer materials can be selected to minimize particle shedding during handling and use of the substrate container 10.

With reference to FIG. 2, an optional removable cover 40 can be removably secured to the container shell 12 to selectively cover and uncover the rear opening 32 (see FIG. 1). In some embodiments, the cover 40 is not used and the rear opening 32 (see FIG. 1) can remain uncovered. Further details on the cover 40 are described further below with respect to FIGS. 8 and 9.

Referring to FIGS. 3-7 (together with FIG. 1), support structure is provided in the interior space 22 for supporting the semiconductor substrates 24 therein. The support structure can have any configuration that is sufficient to support the semiconductor substrates 24 and that permits the removal and insertion of the semiconductor substrates 24 through the rear opening 32 as described herein. In the illustrated example, the support structure supports the semiconductor substrates 24 in a vertically stacked arrangement where the substrates 24 are vertically spaced from one another and each substrate 24 is oriented horizontally substantially parallel to the top wall 18 and the bottom wall 20.

In the example illustrated in FIGS. 1 and 3-7, the support structure comprises a plurality of pairs of opposing support ledges (referred to generally using 42) within the interior space 22 and attached to the opposing side walls 14, 16 of the container shell 12. When viewing the container 12 from the top like in FIG. 5, each pair of opposing support ledges 42 may be referred to as having a right support ledge 42a and a left support ledge 42b. The right and left support ledges 42a, 42b forming each pair of support ledges are configured to support a respective one of the semiconductor substrates 24 in the interior space 22.

Figure 5:
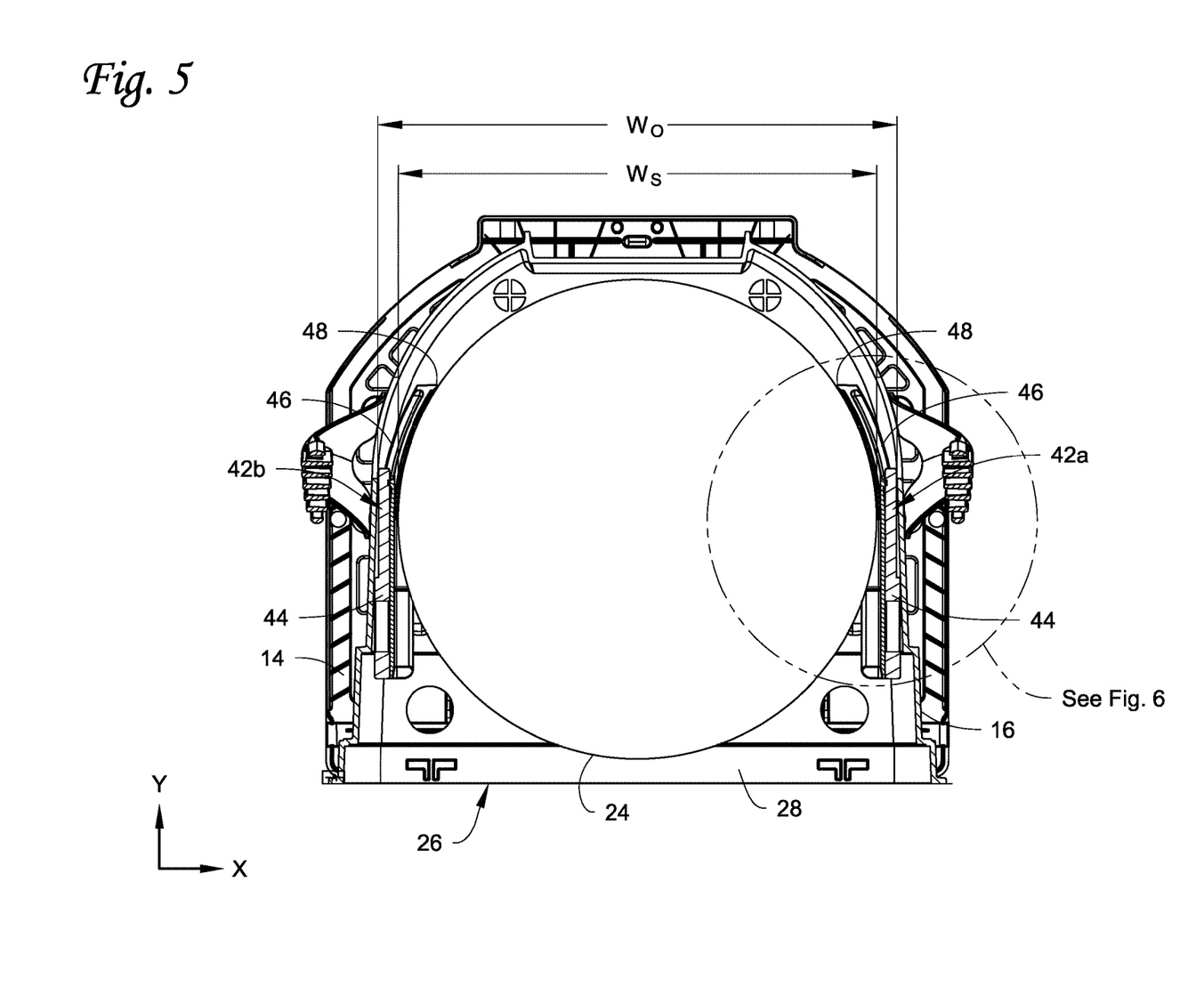
FIG. 5 is a top view of the interior of the container and of a semiconductor substrate contained in the interior space.
Figure 6:
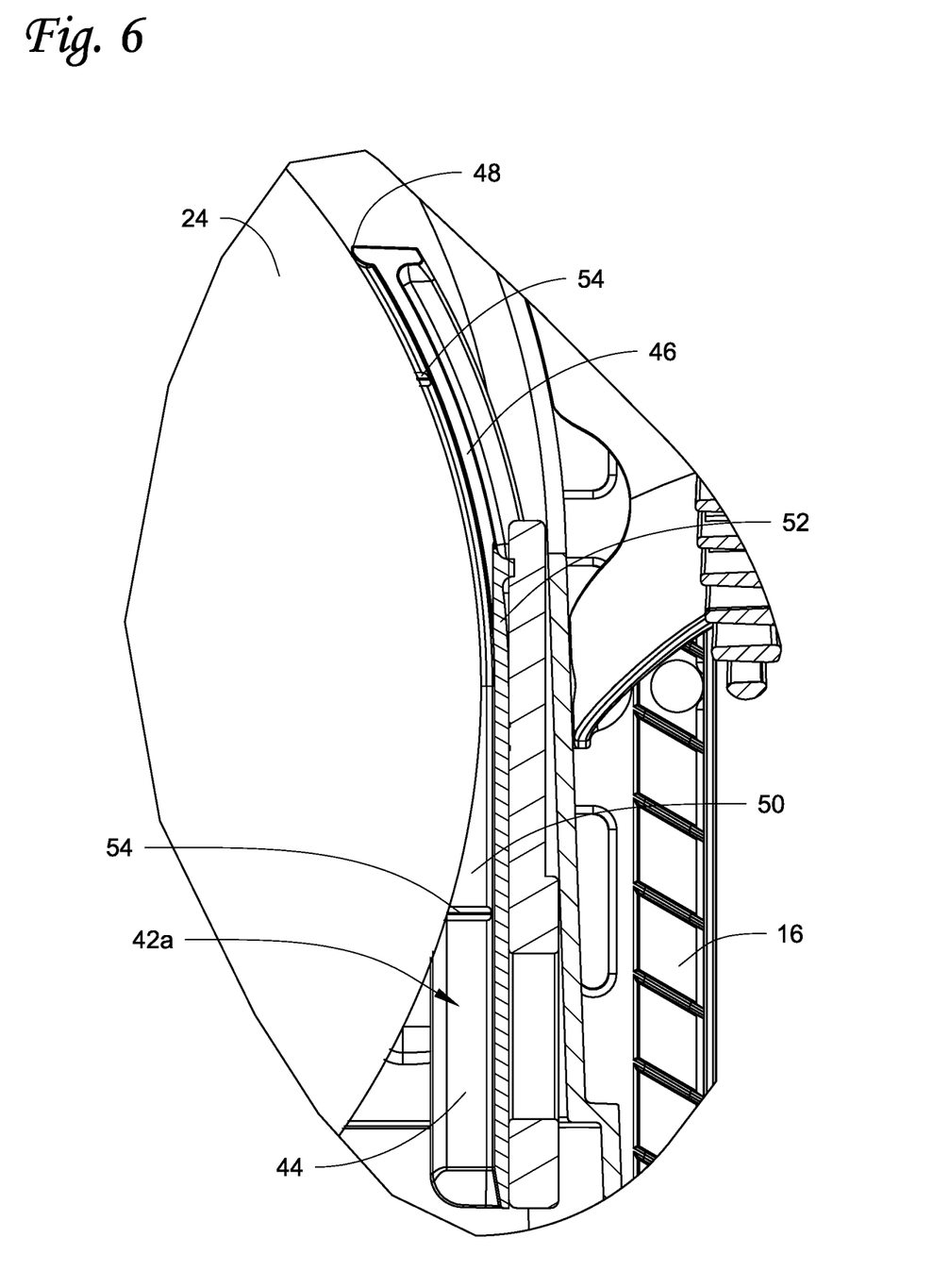
FIG. 6 is a detailed view of the portion contained in circle 6 of FIG. 5.

Referring to FIGS. 5 and 6, each of the right and left support ledges 42a, 42b includes a front portion 44 located toward the front 26 of the shell 12 and a rear portion 46 located toward the rear 30 of the shell 12. The support ledges 42a, 42b position and support the substrate 24 in an X-Y plane. At least one of the rear portions 46 of the support ledges 42a, 42b, and preferably both of the rear portions 46 of the support ledges 42a, 42b, includes a stop 48 that is engageable with the semiconductor substrate 24 to limit insertion of the semiconductor substrate 24 into the interior space 22 in the Y-direction through the front opening 28.

With continued reference to FIGS. 5 and 6, each support ledge 42a, 42b further includes a horizontal ledge portion 50 and a vertical ledge portion 52 extending upwardly from the horizontal ledge portion 50. A plurality of semiconductor substrate positioning pads 54 (or just positioning pads 54) are disposed on the horizontal ledge portion 50. The positioning pads 54 are protrusions on the horizontal ledge portion 50 that the substrate 24 rests on and that position the substrate 24 in the X-Y plane. Any number of positioning pads 54 can be provided. In the illustrated example, each one of the support ledges 42a, 42b includes a front positioning pad 54 and a rear positioning pad 54.

Still referring to FIG. 5, the rear opening 32 is sized to permit removal of each one of the substrates 24 from and insertion of each one of the substrates 24 into the interior space 22. In the illustrated example, the substrate 24 is depicted as having a maximum width Ws. The rear opening 32 is depicted as having a width WO that is greater than the width Ws to permit the substrate 24 to pass through the rear opening 32 upon insertion into or removal from the interior space 22. In one embodiment, the substrate 24 can remain substantially in the X-Y plane as the substrate 24 passes through the rear opening 32 during insertion or removal.

Figure 3:
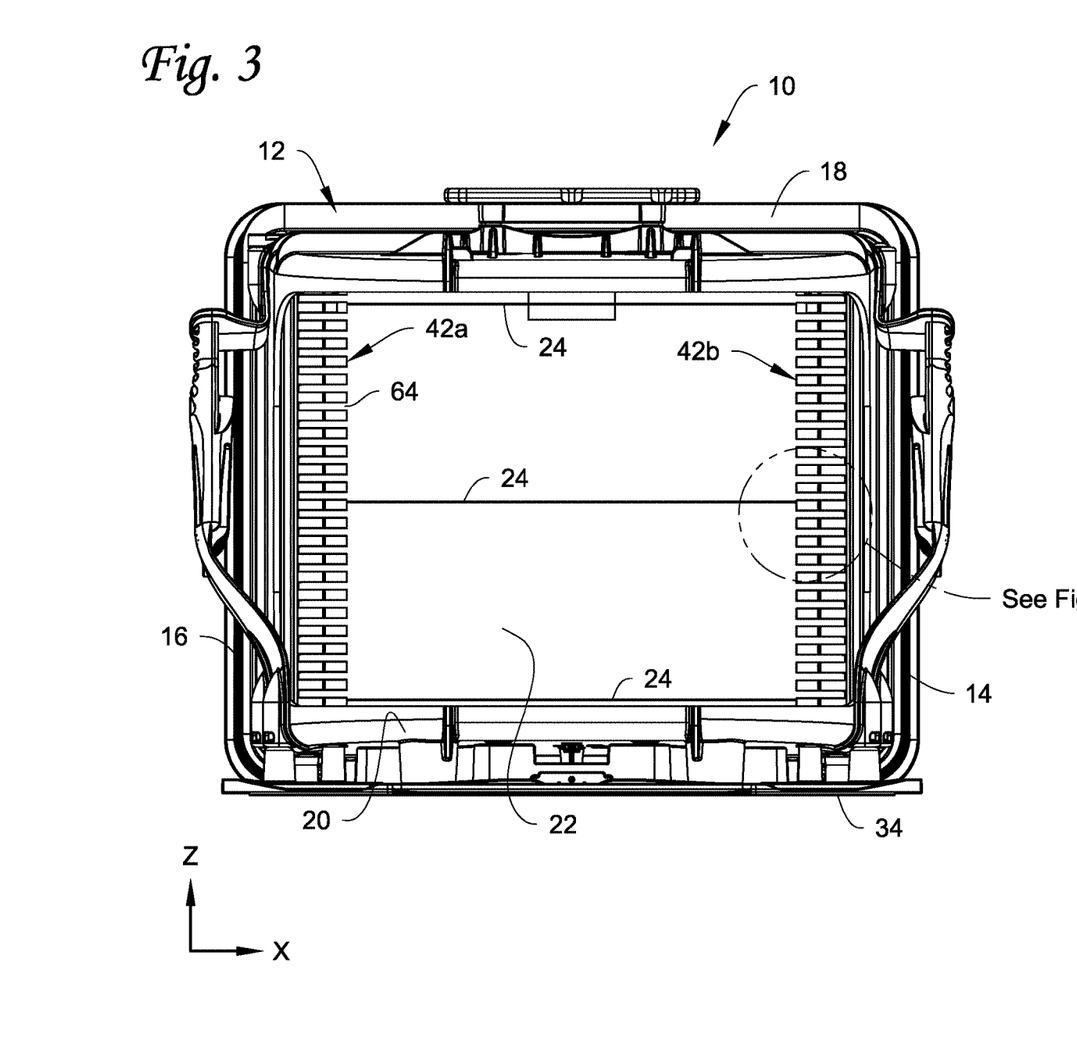
FIG. 3 is a rear view of the container with the cover removed.
Figure 4:
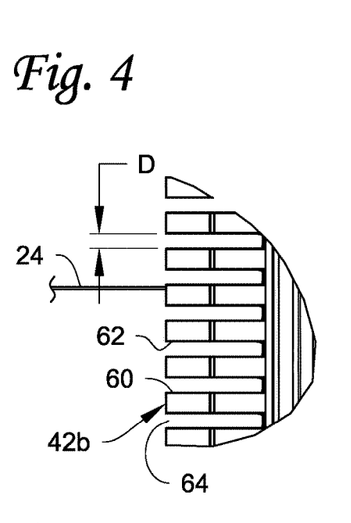
FIG. 4 is a detailed view of the portion contained in circle 4 of FIG. 3.
Figure 7:
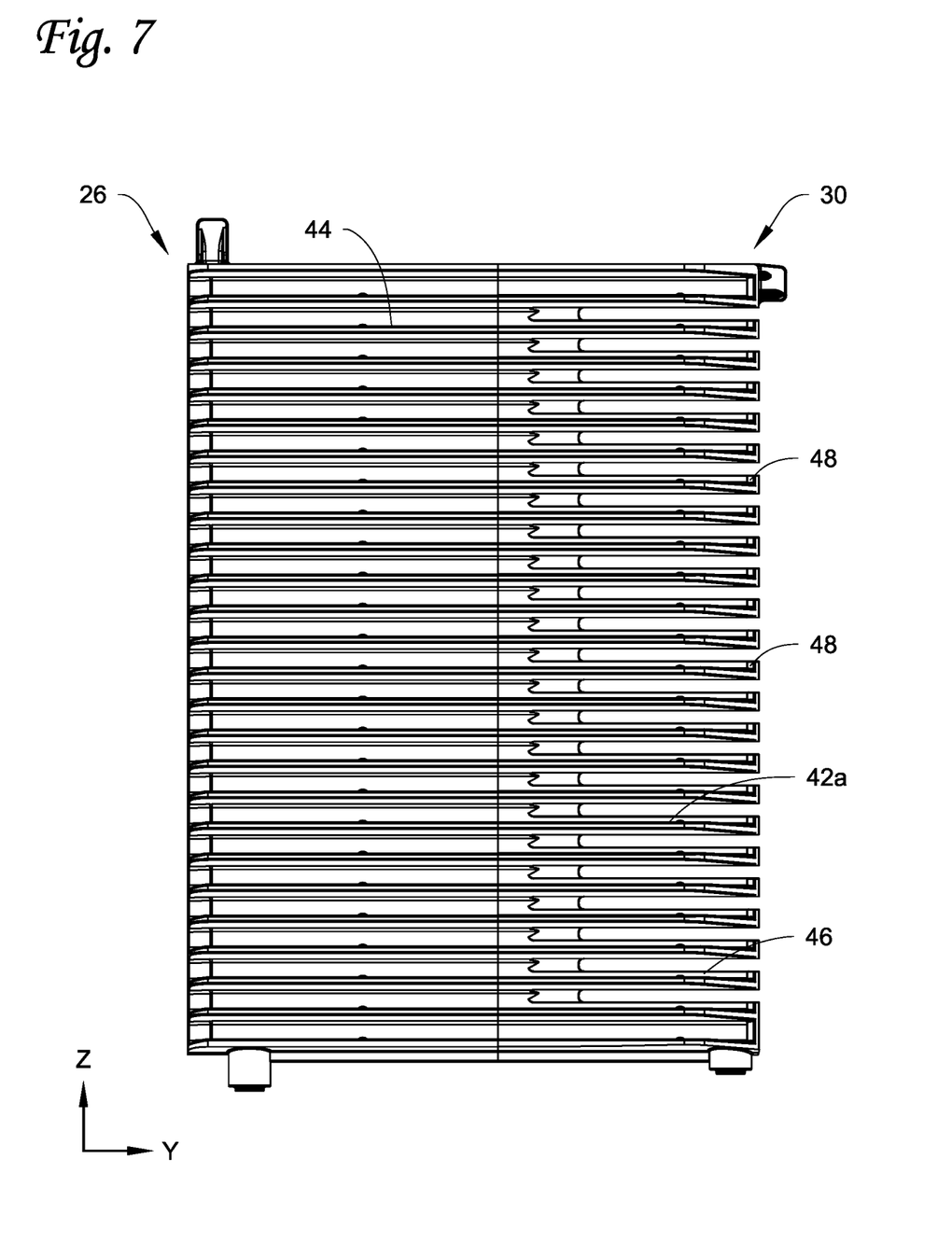
FIG. 7 is close-up side view of substrate support ledges in the interior space of the container.

Referring to FIGS. 3, 4, and 7, in one embodiment the support ledges 42a, 42b may be configured in a manner such that during removal of the substrate 24, the substrate 24 is lifted upwardly vertically before the substrate 24 is removed through the rear opening 32. Similarly, during insertion of a substrate 24 through the rear opening 32, the substrate 24 can be inserted through the rear opening 32 and then lowered vertically onto the support ledges 42a, 42b for support by the support ledges 42a, 42b. However, other removal and insertion sequences can be utilized that do not require any vertical movement of the substrate 24 during insertion or removal.

With continued reference to FIGS. 3 and 4, at the rear portion 46 of each support ledge 42a, 42b, there is a distance D between a top edge 60 of a support ledge and a bottom edge 62 of the support ledge located immediately above it to define a gap or space 64. In addition, as best seen in FIGS. 3 and 4, the support ledges 42a, 42b are configured so that when the substrates 24 are supported on the support ledges 42a, 42b, the substrates are positioned below the top edges 60 of the support ledges 42a, 42b. FIG. 3 depicts three of the substrates 24 each one of which is supported by corresponding pairs of the support ledges 42a, 42b at what can be referred to as substrate positions 2, 13 and 24 of the shell 12.

An example removal sequence will now be described with reference to FIGS. 3 and 4. To remove one of the substrates 24, the substrate 24 to be removed is lifted vertically in the Z-axis direction. For example, the substrate 24 can be lifted manually or via a gripping mechanism of a robot arm that grips the substrate 24 at a location between the support ledges 42a, 42b. During lifting, the substrate 24 may remain substantially in the X-Y plane. The substrate 24 is lifted to a position above the top edges 60 of the support ledges 42a, 42b supporting the substrate 24 but below the bottom edges 62 of the support ledges 42a, 42b located above. Once the substrate 24 is lifted above the top edges 60 of the associated support ledges 42a, 42b, the substrate 24 may then be withdrawn through the rear opening 32, for example in the Y-axis direction. Insertion of one of the substrates 24 works just the opposite, where the substrate 24 to be inserted is moved through the rear opening 32 in the Y-axis direction to a position between adjacent pairs of support ledges 42a, 42b, and the substrate 24 is then lowered vertically down onto the associated pair of support ledges 42a, 42b.

Returning to FIG. 2, use of the cover 40 is optional. If the cover 40 is used, the cover 40 can be configured to have a first position (shown in FIGS. 2 and 5) where the cover 40 is attached to the shell 12 and covers the rear opening 32 (see FIG. 1) and a second position where the cover 40 does not cover the rear opening 32 thereby allowing removal and insertion of one or more of the substrates 24 through the rear opening 32. The cover 40 may remain attached to the shell 12 at the second position, or the cover 40 may be detached from the shell 12 at the second position. The example of the cover 40 illustrated in FIGS. 2, 5 and 8-9 depicts the cover 40 as being completely detached from the shell 12 at the second position. In addition, the cover 40 can be attached to the shell 12 in any suitable manner that permits the cover 40 to assume the first position and the second position. In addition, the cover 40 may be configured to be automatically actuated between the first position and the second position, or the cover 40 may be configured to be manually actuated between the first position and the second position.

Referring to FIGS. 2, 5 and 8-9, in the illustrated example the cover 40 is configured to be manually actuated and to snap fit connect to the shell 12. For example, the cover 40 can have an upper retention feature 70 (FIG. 9) with a slot that receives an edge 72 of a portion 74 of the top wall 18 of shell 12 at the rear opening 32 (see FIG. 1), a lower retention feature 76 (FIG. 9) with a flexible lip that is configured to snap fit connect behind a corresponding retention feature 78, such as a flange, on the bottom wall 20 of the shell 12 at the rear opening 32 (see FIG. 1), and a pair of side retention features 80, 82 (FIGS. 8 and 9) each with a slot 84 that receives an edge of one of the side walls 16, 14 of the shell 12.

In one embodiment, the cover 40 may be created from the portion of the shell 12 that is removed to form the rear opening 32. In other embodiments, the cover 40 can be created from separate materials. The retention features 70, 76, 80, 82 can be separate elements that are later attached to the cover 40 once the portion is removed from the shell 12 to create the rear opening 32.

Figure 8:
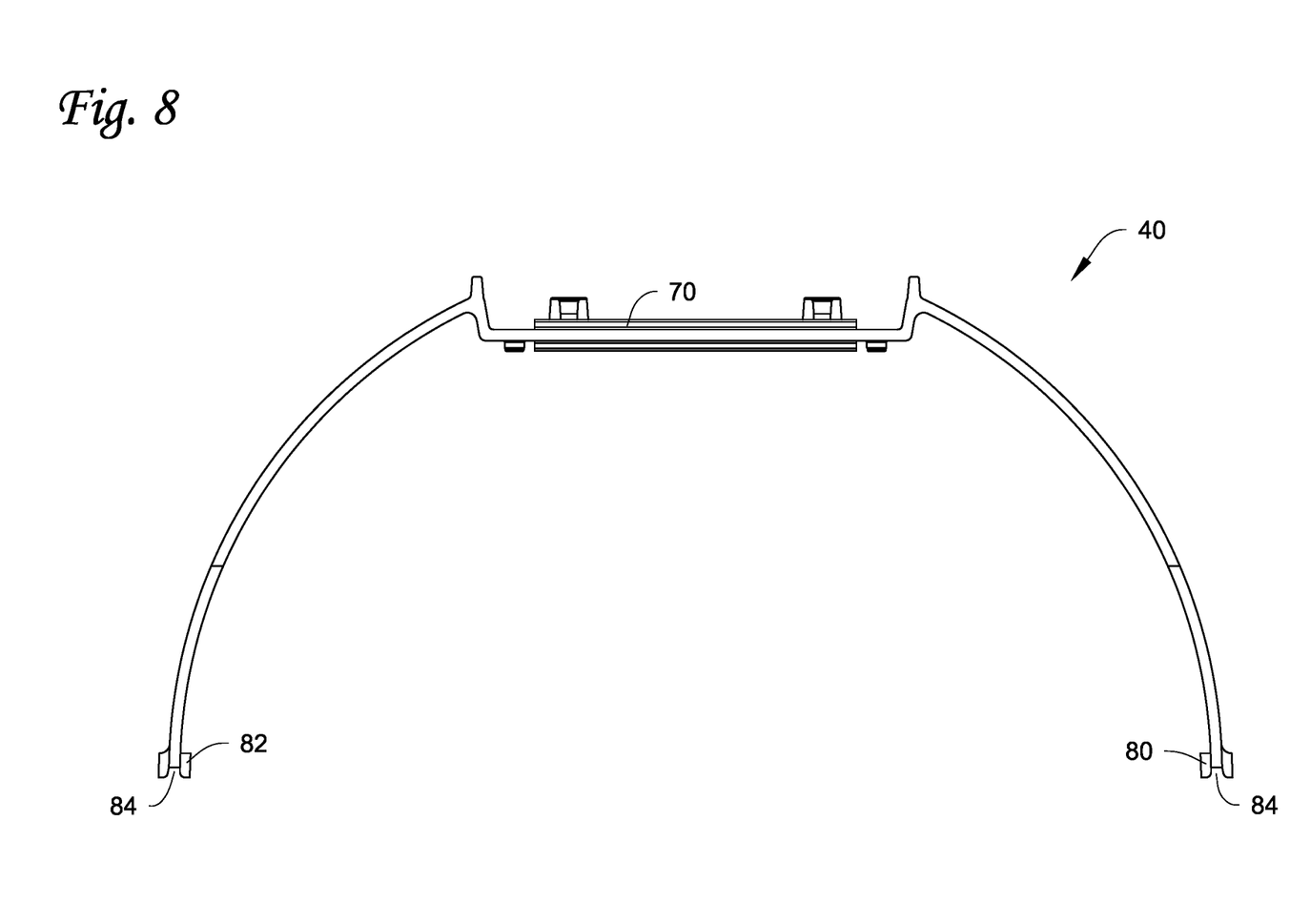
FIG. 8 is a top view of the removable cover of FIG. 2 removed from the container.
Figure 9:
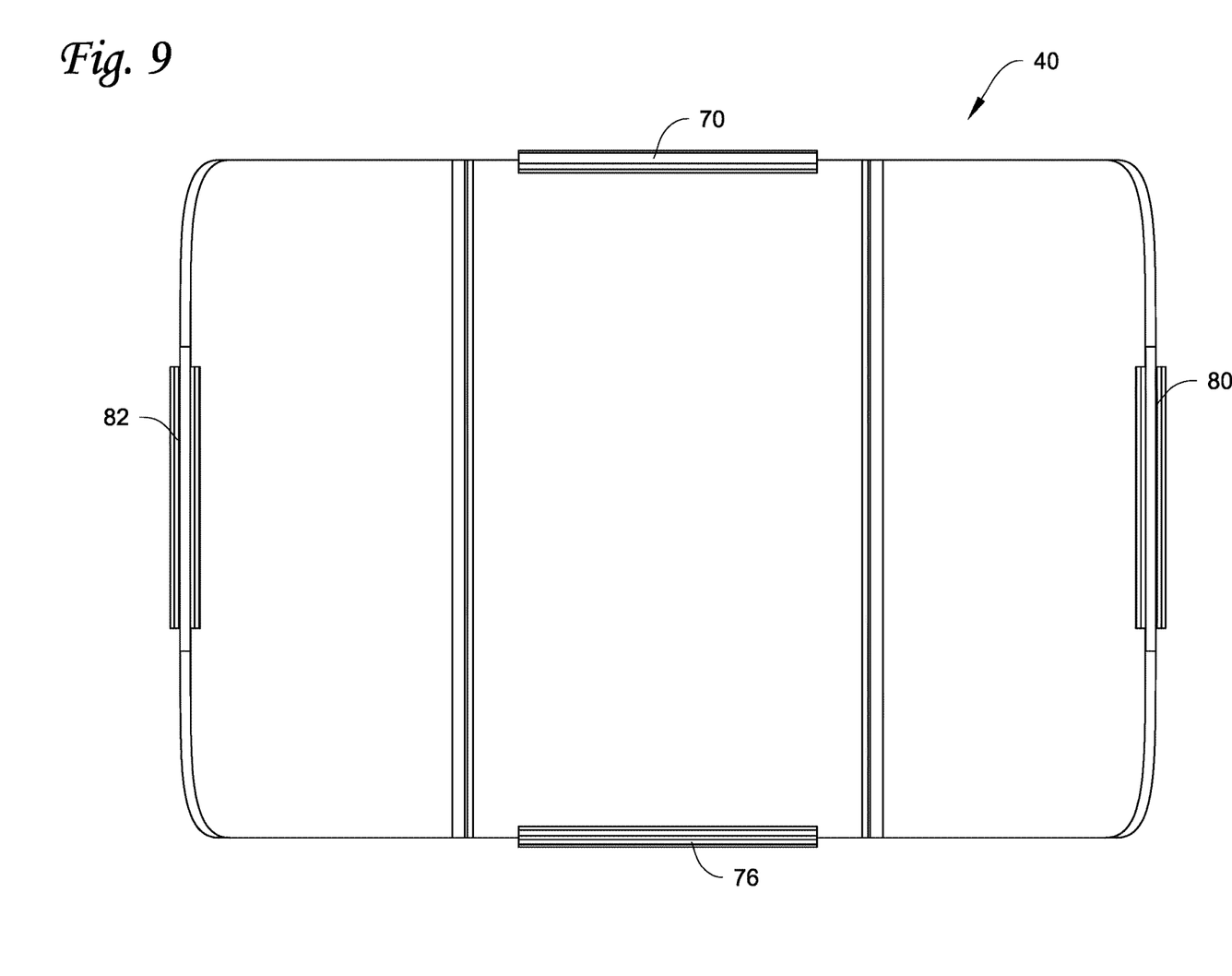
FIG. 9 is an end view of the inside of the removable cover.

With reference to FIGS. 1 and 8-9, to install the cover 40 on the shell 12 to the first position to cover the rear opening 32, the upper retention feature 70 is engaged with the edge 72 of the shell 12 and the cover 40 is then rotated down until the slots 84 of the side retention features 80, 82 engage the edges of the side walls of the shell 12. Generally simultaneously with the side retention features 80, 82 engaging, the lower retention feature 76 starts engaging the retention feature 78 and the retention feature 76 flexes and snap-fit connects with the retention feature 78. Removal of the cover 40 to the second position is the opposite. The lower retention feature 76 is first disconnected from the retention feature 78, and the cover 40 is then swung upwardly to disengage the side retention features 80, 82 and the then the upper retention feature 70. The cover 40 can then be set-aside until insertion or removal through the rear opening 32 is no longer necessary at which time the cover 40 can be re-attached to the shell 12 to cover the rear opening 32.

Having the rear opening 32 in the container 10 provides a number of benefits. With reference to FIGS. 1 and 5, one benefit is that one of the semiconductor substrates 24 can be removed via the rear opening 32 to permit at least one analysis to be performed on the removed semiconductor substrate, without interfering with substrate removal and insertion operations occurring through the front opening 28. The analysis may be to check the quality of a processing operation on the substrate, for example in the case of the substrate being a wafer the quality of semiconductor chips added to the wafer can be checked, or to check the cleanliness of the substrate. The removed substrate 24 may or may not be reinserted back into the container 10. If the removed substrate 24 is to be reinserted, the reinsertion may occur through the rear opening 32 or even via the front opening 28. In some embodiments, a substrate 24 may be inserted into the container 10 via the rear opening 32 where that substrate 24 was not previously removed from the container 10 (either via the rear opening 32 or the front opening 28). For example, a wafer may be inserted into the container via the rear opening 32.

With continued reference to FIGS. 1 and 5, in one embodiment, the container 10 may be configured so that a first number of the semiconductor substrates 24 can be removed from and inserted into the interior space 22 via the front opening 28, while a second number of the semiconductor substrates 24 can be removed from and inserted into the interior space 22 via the rear opening 32, where the first number of substrates is greater than the second number of substrates. For example, in a non-limiting example where the container 10 is configured to hold a maximum of twenty-four of the substrates 24, twenty-four of the substrates 24 can be inserted into and removed from the interior space 22 via the front opening, while only twenty-two of the substrates 24 may be removed from and inserted into the interior space 22 via the rear opening 32. However, in other designs of the container 10, the same number of substrates 24 may be inserted and removed via the front opening 28 and via the rear opening 32.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A semiconductor substrate carrying container, comprising:
   a front opening unified pod having a plurality of walls, a front, and a rear, the plurality of walls defining an interior space that is sized to be able to receive a plurality of semiconductor substrates therein;
   a front opening at the front of the front opening unified pod and through which a semiconductor substrate is able to be removed from and inserted into the interior space;
   a rear opening at the rear of the front opening unified pod and through which a semiconductor substrate is able to be removed from and inserted into the interior space; and
   a cover associated with the front opening unified pod, the cover has a first position where the cover is attached to the container shell and covers the rear opening and a second position where the cover does not cover the rear opening;
   wherein when the cover is at the second position a semiconductor substrate can be removed from and inserted into the interior space through the rear opening.

2. The semiconductor substrate carrying container of claim 1, wherein the plurality of walls include opposing side walls, and further comprising a plurality of pairs of opposing support ledges within the interior space and attached to the opposing side walls of the front opening unified pod, each pair of opposing support ledges is configured to support a semiconductor substrate in the interior space.

3. The semiconductor substrate carrying container of claim 2, wherein each support ledge comprises a front portion and a rear portion, and at least one of the rear portions of the opposing support ledges of each pair includes a stop that is engageable with a semiconductor substrate to limit insertion of the semiconductor substrate into the interior space.

4. The semiconductor substrate carrying container of claim 2, wherein each support ledge comprises: a horizontal ledge portion and a vertical ledge portion extending upwardly from the horizontal ledge portion, and further comprising a plurality of semiconductor substrate positioning pads on the horizontal ledge portion.

5. The semiconductor substrate carrying container of claim 1, wherein the semiconductor substrate carrying container is configured to permit a first number of semiconductor substrates to be removed from and inserted into the interior space via the front opening and configured to permit a second number of semiconductor substrates to be removed from and inserted into the interior space via the rear opening, and the first number of semiconductor substrates is greater than the second number of semiconductor substrates.

6. The semiconductor substrate carrying container of claim 1, wherein the semiconductor substrates comprise wafers or flat panels.

7. A front opening unified pod, comprising:
a shell having a front opening and an interior space;
a rear opening at a rear of the shell opposite the front opening and through which a semiconductor substrate is able to be removed from and inserted into the interior space;
a plurality of pairs of opposing support ledges within the interior space and attached to side walls of the shell, each pair of opposing support ledges is configured to support a semiconductor substrate in the interior space; and
a cover associated with the container shell, the cover has a first position where the cover is attached to the container shell and covers the rear opening and a second position where the cover does not cover the rear opening, wherein when the cover is at the second position a semiconductor substrate can be removed from and inserted into the interior space through the rear opening.

8. The front opening unified pod of claim 7, wherein each support ledge comprises a front portion and a rear portion, and at least one of the rear portions of the opposing support ledges of each pair includes a stop that is engageable with a semiconductor substrate to limit insertion of the semiconductor substrate into the interior space.

9. The front opening unified pod of claim 7, wherein each support ledge comprises: a horizontal ledge portion and a vertical ledge portion extending upwardly from the horizontal ledge portion, and further comprising a plurality of semiconductor substrate positioning pads on the horizontal ledge portion.

10. The front opening unified pod of claim 7, further comprising a cover associated with the shell, the cover has a first position where the cover is attached to the shell and covers the rear opening and a second position where the cover does not cover the rear opening, and when the cover is at the second position a semiconductor substrate can be removed from or inserted into the interior space through the rear opening.

11. The front opening unified pod of claim 7, wherein the front opening unified pod is configured to permit a first number of semiconductor substrates to be removed from and inserted into the interior space via the front opening and configured to permit a second number of semiconductor substrates to be removed from and inserted into the interior space via the rear opening, and the first number of semiconductor substrates is greater than the second number of semiconductor substrates.

12. The front opening unified pod of claim 7, wherein the semiconductor substrates comprise wafers or flat panels.

13. A method comprising removing a semiconductor substrate from or inserting a semiconductor substrate into an interior space of a front opening unified pod through a rear opening at a rear of the front opening unified pod located opposite a front opening of the front opening unified pod.

14. The method of claim 13, further comprising moving the semiconductor substrate vertically within the interior space during removal of the semiconductor substrate from or insertion of the semiconductor substrate into the interior space through the rear opening.

15. The method of claim 13, wherein the semiconductor substrate comprises a wafer or a flat panel.

16. The method of claim 13, comprising removing the semiconductor substrate from the interior space through the rear opening; and after removing the semiconductor substrate, performing at least one analysis on the semiconductor substrate.

17. The method of claim 16, further comprising:
after the at least one analysis, re-inserting the removed semiconductor substrate back into the front opening unified pod through the rear opening.

* * * * *